Figure 1:
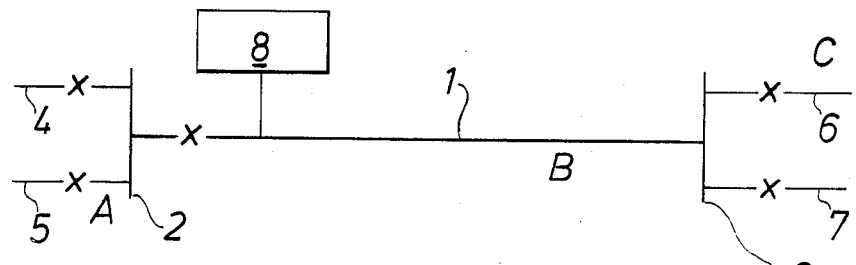

United States Patent [19]

Wright et al.

[11] Patent Number: 4,499,417
[45] Date of Patent: Feb. 12, 1985

[54] DETERMINING LOCATION OF FAULTS IN POWER TRANSMISSION LINES

[75] Inventors: Arthur Wright, Bridgford; Christos Christopoulos, Wollaton, both of England

[73] Assignee: General Electric Company pl.C., London, England

[21] Appl. No.: 436,806

[22] Filed: Oct. 26, 1982

[30] Foreign Application Priority Data

Oct. 27, 1981 [GB] United Kingdom ............... 8132378

[51] Int. Cl.³ ............................................. G01R 31/08
[52] U.S. Cl. ........................................................ 324/52
[58] Field of Search ................... 324/52; 361/87, 80; 179/175.3 F

[56] References Cited

U.S. PATENT DOCUMENTS

| | | | |
|---|---|---|---|
| 2,493,800 | 1/1950 | Biskeborn | 324/52 |
| 2,628,267 | 2/1953 | Stringfield et al. | 324/52 |
| 2,725,526 | 11/1955 | Stringfield et al. | 324/52 |
| 3,462,681 | 8/1969 | Biskup | 324/52 |
| 3,609,533 | 9/1971 | Pardis | 324/52 |
| 4,241,305 | 12/1980 | Dickerson | 324/52 |
| 4,316,139 | 2/1982 | Root | 324/52 |

Primary Examiner—Stanley T. Krawczewicz
Attorney, Agent, or Firm—William R. Hinds

[57] ABSTRACT

The position of a fault occurring in an electric power transmission line (1) is determined by "labelling" a voltage or current pulse originating from the fault and reflected by the end of the line, or some other point in the system, moving back towards the fault, and then measuring the time taken for the labelled pulse to return to the measuring point near the end of line. The "labelling" is achieved by predicting from known data and the time of arrival of the reflected pulse the amplitude of the voltage pulse and comparing the prediction with the measured value. Apparatus for carrying out the method is described.

9 Claims, 4 Drawing Figures

DETERMINING LOCATION OF FAULTS IN POWER TRANSMISSION LINES

This invention relates to a method and apparatus for determining the location of a fault occurring in an electric power transmission line.

Several protective schemes have been produced in the past to determine, in the event of faults on the network, whether the particular transmission line being protected by the scheme is healthy or not. Should the fault be associated with the line, then appropriate action such as the tripping of circuit breakers, is initiated.

Some of the existing schemes involve making comparisons of the currents flowing in the conductors at the two ends of the protected line. Such schemes, while providing satisfactory performance, require a means of comparing the quantities at the two ends, which may be a considerable distance apart, and consequently complex and costly signalling channels and equipment are necessary.

An alternative techniquie is to determine the position of any fault by processing signals proportional to the voltages and currents at one end of a line and thereby to assess the input impedances of the line. When at least one of these impedances is below a certan preset value, indicating that a fault is present on the line, the opening of the associated circuit breaker is initiated. Such schemes must be installed at both ends of a protected line to ensure that faults are cleared. The schemes are quite complex to enable them to operate correctly under all possible fault conditions, and because of the processing procedures employed, their operating times are of the order of 20 ms. They do not basically rely on signals transmitted between the line ends but equipment to send such signals is sometimes provided to enable improve performance to be obtained.

A more recent development has been the introduction of protective schemes which rely for their operation on the disturbances produced when faults occur on electrical networks containing transmission lines. The existing schemes operate from the currents and voltages at the ends of the line. At each end, signals derived from these quantities are processed to determine the direction from which the disturbance is travelling. It is then possible to determine whether the fault is behind the measuring point i.e. at point A in FIG. 1 or in the opposite direction, i.e. on the protected line or beyond it, points B or C in FIG. 1. This information is not sufficient to indicate whether the line is healthy or not and interlocking signals must be sent between the line ends to achieve satisfactory discrimination.

In EP No. 0 062 446 A there is disclosed a method of and apparatus for locating the position of a fault occurring in an electric power transmission system, in which an indication of the position of the fault with respect to a single monitoring point is obtained from the time taken for a disturbance to travel from the monitoring point to the fault and back to the monitoring point after reflection at the point. A problem which could arise with this method is that the disturbance which is timed after reflection can be confused with other disturbances arriving at the monitoring point as a result of reflections from other points in the transmission system. This can result in the protected section of the system being unnecessarily removed from service, when the fault is outside the protected section.

The present invention provides a method which comprises the steps of
(i) detecting at a point adjacent to one end of the line a first disturbance in voltage and/or current in the line resulting from occurrence of the fault,
(ii) comparing at least one characteristic of each disturbance detected after the first disturbance with the or each characteristic predicted from values measured in the first disturbance, and thereby identifying a reflected disturbance in voltage and/or current produced by reflection of the first disturbance from the said one end, or another point beyond said one end, and then from the fault,
(iii) determining the time taken for the reflected disturbance to travel from the said point to the fault and back to the said point after reflection at the fault, and
(iv) obtaining from said time the distance between the said point and the fault.

In a preferred embodiment of the invention, the method comprises the steps of
(i) measuring the voltage and current at regular intervals at a point adjacent to one end of the line and storing measured values representing at least the immediately preceding cycle or half-cycle of the alternating voltage and current,
(ii) comparing each measured value with that for the corresponding instant in the preceding cycle or half-cycle and thereby detecting any disturbance in voltage and current,
(iii) measuring the time elapsed from detection of the first disturbance in current and voltage resulting from occurrence of the fault to detection of the next disturbance in current and/or voltage,
(iv) calculating from said elapsed time a value for the distance of the fault from the said point assuming said next disturbance to have resulted from direct reflection of the first disturbance from the said one end and then from the fault,
(v) calculating from said distance value, from the values of the first disturbances in current and voltage, and from selected stored measured values, a predicted magnitude of disturbance of voltage and/or current for a direct reflection of the first disturbance from the said one end and then from the fault,
(vi) comparing the measured magnitude of said next disturbance with the predicted magnitude, and if the difference between said measured and predicted magnitudes is greater than a predetermined amount repeating steps (iii), (iv), (v) and (vi) for the next disturbance detected, and
(vii) selecting the distance value calculated.

The apparatus of the invention comprises
(i) means for detecting at a point adjacent to one end of theline a first disturbance in voltage and/or current in the line resulting from occurrance of the fault,
(ii) comparison and processing means arranged to compare at least one characteristic of each disturbance detected after the first disturbance with the or each characteristic predicted from values measured in the first disturbance and thereby to identify a reflected disturbance in voltage and/or current produced by reflection of the first disturbance from the said one end, or another point beyond said one end, and then from the fault, (iii) timing means for determining the time taken for the reflected disturbance to travel from the said point to the fault and back to said point after reflection at the fault, and (iv) further processing means for calculating from said time measured by the timing means the distance between the said point and the fault.

A preferred form of the apparatus comprises (i) current and voltage measuring devices connected to a point on the line adjacent to one end thereof, (ii) sampling means arranged to sample regularly the output from the measuring devices, (iii) a store arranged to receive the samples from the sampling means and to store samples representing at least the half-cycle of the waveform immediately preceding each sample received, (iv) first comparison means for comparing each sample with the corresponding sample in the preceding half-cycle, (v) timing means for measuring the time elapsed from detection of the first disturbance in current and voltage resulting from occurrence of the fault to detection of the next disturbance in current and/or voltage, (vi) first processing means arranged to calculate from said elapsed time a value for the distance of the fault from said point assuming said next disturbance to have resulted from direct reflection of the first disturbance from the said one end and then from the fault, (vii) second processing means arranged to calculate from said distance value, from the values of the first disturbances in current and voltage, and from selected stored measured values, a predicted magnitude of disturbance of voltage and/or current for a direct reflection of the first disturbance from the said one end and then from the fault, (viii) second comparison means for comparing the difference between the measured magnitude of said next disturbance and the predicted value with a predetermined value and responsive to said difference being greater than said predetermined value to initiate further operation of the first and second processing means and the second comparison means for the next disturbance in current and/or voltage detected, and (ix) means responsive to said difference being equal to or smaller than said predetermined value to recieve from the first processing means the distance value calculated thereby.

The necessary input information is preferably derived from the outputs of voltage and current transducers sited at one end of the line, near the circuit breakers. In practice, the lines are usually three phase, and so transducers would be included to provide signals related to the conductor currents and the interphase and phase-to-earth voltages.

The scheme will achieve the desired discrimination by arranging equipment to cover zones in the same way as existing distance protective schemes.

The advantages of the invention are that the operation will be extremely fast and be unaffected by the loads connected to the network. It will not need communication links between the line ends to determine the fault positions, although such links could be used to accelerate operation for faults near the line ends. Accuracy of detection is enhanced in comparison with existing systems, reducing the risk of erroneous removal of the line from services as a result of faults arising elsewhere.

Figure 2:
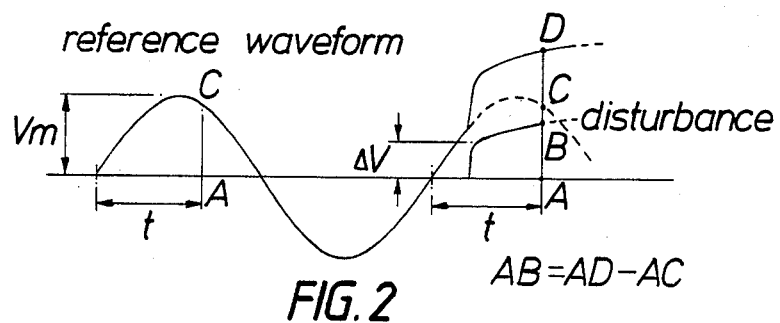
Figure 3:
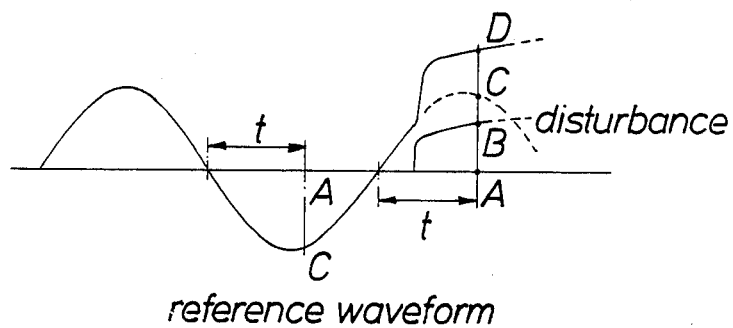
Figure 4:
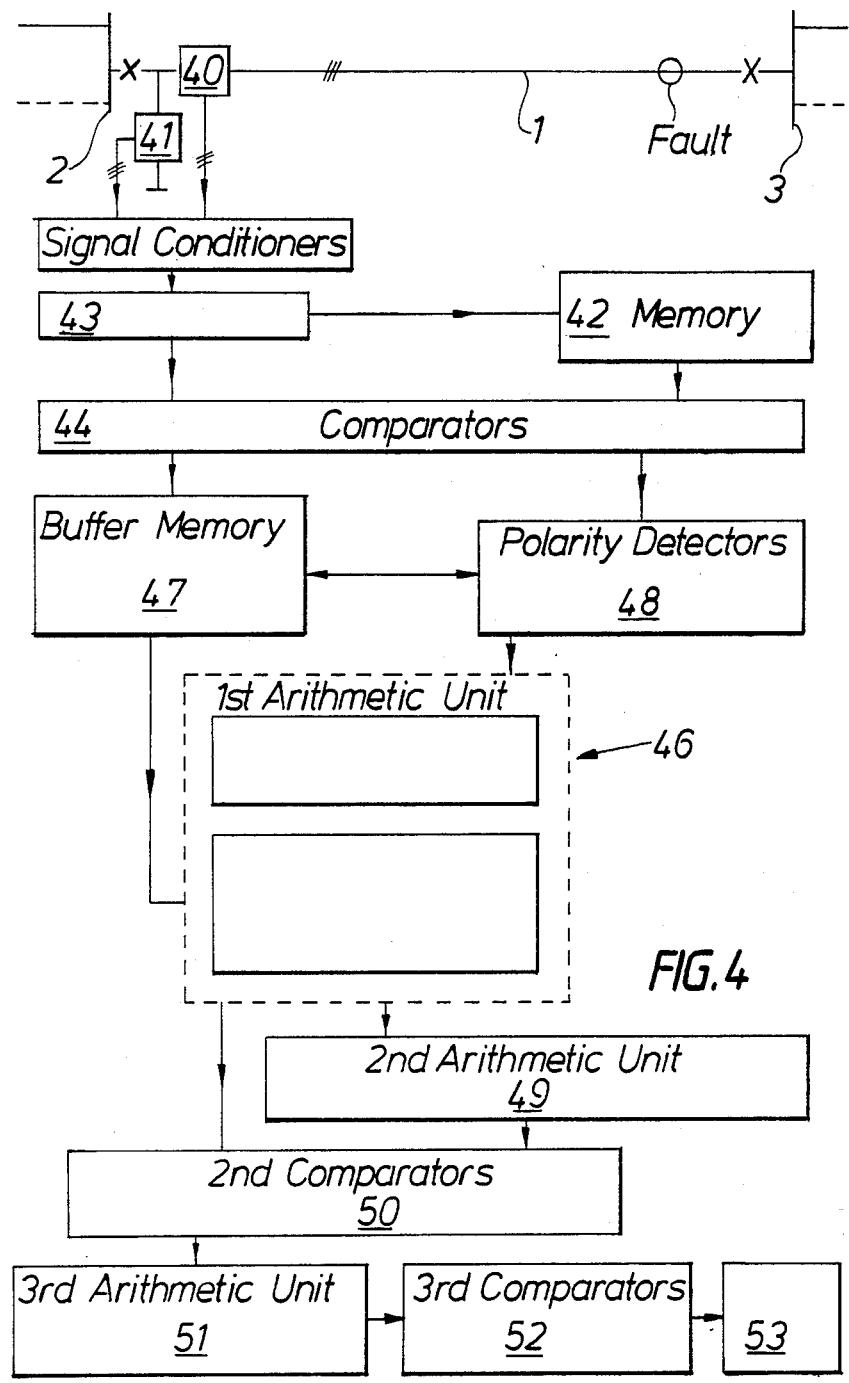

The method and apparatus will be described further by way of example, with reference to the drawings, in which FIG. 1 illustrates diagrammatically a part of an electric power transmission system;

FIGS. 2 and 3 show portions of an alternating voltage waveform, illustrating the method of detection of a voltage disturbance; and FIG. 4 is a schematic diagram of a fault location detection apparatus.

Referring first to FIG. 1, a typical section of a power transmission system includes a line 1, constituting the protection zone which is to be monitored, between two bus bars 2 and 3 each connected to further lines 4 and 5, 6 and 7 respectively. Apparatus 8 in accordance with the invention is connected to the line 1 adjacent to one end thereof. Possible fault locations, within and outside the protection zone, are indicated at A, B, and C.

On occurrence of a fault at B, within the protection zone, a disturbance in the form of travelling waves moves outwardly along the line from B and is detected by the apparatus 8.

Because the method is dependent on the travelling waves, which are transient, it is necessary to isolate these by removing the steady state current and voltage components from the signals provided by the transducers within the apparatus 8. This could be done in several ways, one satisfactory method, which has been used in the past, being continually to monitor the transducer outputs and to store the signals for a period corresponding to the duration of one whole or one half cycle of the power-system (i.e. 0.02 or 0.01 s for a 50 Hz system). In the former case, the stored quantities are subtracted from the signals during the next cycle to give zero output in each case, when the circuit conditions are unchanged. This process, which is illustrated in FIG. 2, can be done by sampling the waves and storing them digitally. They can then be recovered in their original form for subtraction by using digital/analogue convertors. If the second method involving one half-cycle storage is used, the quantities are recovered and added to those of the next half-cycle, as shown in FIG. 3, to give zero signals when conditions are not changing.

The output of non-zero quantities at the end of this process indicates the presence of a disturbance and the outputs may then be processed to detect whether there is a fault on the line.

The occurrence of a short circuit at a point in a network instantly changes the voltage at the point and initiates travelling waves of voltage and current on transmission lines, the initial magnitudes of these waves being dependent on the voltages at the fault point at the instant of fault occurrance. On arrival at the end of a line the travelling waves are completely or partially reflected, depending on the circuits connected to the end of the line. The voltage and current changes detected as described above, may nevertheless be analysed to determine the magnitudes of the initial incoming waves and therefore the voltages which existed at the fault position when the fault occurred, assuming that the fault resistance is zero. The time at which these voltages were present may be found from the variations which have been occurred in the line end voltages and currents and thus the time taken for the waves to travel from the fault to the line end may be determined. Because the velocity of the travelling waves is known the fault position can be found.

A possible method of determining the position of a line fault is described below, a single phase circuit of length L being considered for simplicity. From the movement of the first voltage and current disturbances at the monitoring point the voltage $V_{(d)}$ injected into the line when a fault occurs at the location x=d can be calculated. The prefault voltage profile on the line is described by equation (1).

$$V_{(x)} = V_{(L)} \cos h \, \gamma (L - x) + I_{(L)} Z \sin h \, \gamma (x - L) \quad (1)$$

where $V_{(x)}$ is the voltage on the line at a distance x from the remote end of the protection zone and $V_{(L)}$, $I_{(L)}$ are the voltage and current respectively at the monitoring point. The propagation constant $\gamma$ and the surge impedance Z of the line are known in advance for a particular line. The voltage $V_{(d)}$ is related by equation (1) applied for x=d to the voltage current $V_{(L)}$ and $I_{(L)}$ at the monitoring point at the time of the fault initiation.

From the stored voltage and current waveforms the voltage $V_{(L)}'$ and the current $I_{(L)}'$ at the monitoring point just prior to the arrival of the first disturbance are obtained. The values of $V_{(L)}$ and $I_{(L)}$ at the monitoring point at the instant of fault can be derived as a function of the fault location x=d and the speed of propagation. Thus the location of the fault can be determined by equation (1).

To this basic scheme several refinements are added to avoid possible malfunctions imposed by the following conditions. The voltage injected into the line following the fault is affected by the value of the fault resistance $R_f$. In addition, for a complex interconnected system an external fault could erroneously appear as an internal fault if, for instance, the electrical conditions at the point of fault were similar to those at a point inside the protected zone. To overcome these problems, disturbances arriving at the monitoring point are identified and labelled as described below. After the arrival of the first disturbance at the monitoring point a more general form of equation (1) is set up where allowance can be made for the finite fault resistance $R_f$. This equation contains two unknowns, the fault resistance, $R_f$, and the fault location, d. Several subsequent disturbances will be detected at the monitoring point, some coming from the protection zone and some from the opposite side.

Consider the first disturbance arriving from ther protectin zone side of the monitoring point. A proportion $(V_a)$, of this pulse which can be calculated, will be reflected back into the protection zone, reflected from the fault and will arrive back at the monitoring point. In accordance with the disclosure of EP No. 0 062 446 A, it is known that if the time interval between the departure of this disturbacne $V_A$ from the monitoring point and its return is measured, an accurate determination of the fault location can be made. The main problem here is the separation of this disturbance from other distrubances which arrive at the monitoring point having resulted from reflections from other parts of the interconnected system. The pulse which follows the route, monitoring point-fault-monitoring point is described as a labelled pulse. When further disturbances $\Delta v^{(n)}$ arrive at the monitoring point at time $t^{(n)}$ following the first disturbance they must be tested to determine if they are the labelled pulse. Then from the time interval $t^{(n)}$ the location of the fault can be calculated and hence from the generalised form of equation (1) the value of the fault resistance can be obtained. Knowing the magnitude of the pulse leaving the monitoring point $V_a$ and the fault resistance $R_f$ thus calculated, the theoretically expected value of the disturbance arriving at the relaying point can be calculated. This value is compared with the measured value $\Delta V^{(n)}$. If this comparison indicates close argeement between the two values the detected disturbance is in fact the labelled pulse and the location of the fault, based on the measurements of the time interval $t^{(n)}$, is the correct one. Otherwise successive pulses are similarly analysed until the labelled pulse is received. In practise this analysis need not be prolonged for pulses arriving after two protection zone transit times following the arrival of the first disturbance. More than one pulse may be lablelled in a similar way to enhance, if need be, the level of confidence in the determination of the fault location.

Similarly pulses arising at the monitoring point from the opposite side of the protection zone and entering the protection zone can be labelled and used to determine the fault location from the time interval measurements. The magnitude of the disturbance entering the protection zone and the monitoring point can be measured. This pulse travels to the fault point and is essentially reflected with opposite sign. The time interval is then measured between the departure of the pulse and the arrival of a pulse with an almost equal magnitude but opposite polarity. The generalised form of equation (1) can again be used for positive identification. The fault location is thus determined. Again these measurements need not be continued for more than two protection zone transit times. If desired, pulses of both types may be used to enhance confidence in fault location. In these calculation using labelled pulses, allowances can be made in situations where the remote end of the protection zone is beyond a remote bus at which two or more transmission lines are connected.

In multiphase and/or multiwire systems in the proximity of earth, similar calculations can be done using the voltages and currents at the monitoring point and allowance would also be made for the presence of more than one mode of propagation. The proportions of the energy in the disturbances which propogate in each mode can be determined. The particular speed and surge impedance associated with each mode of propagation is also known. Hence from the measurement and analysis of the disturbances detected on each wire at the monitoring point, the location and the type of fault can be determined.

To deal with faults which occur at a time when the fault point is at zero or a very low voltage the scheme will be arranged to take into account changes which have occurred over a few milliseconds, the technique being an extension of that described above.

FIG. 4 illustrates in schematic form apparatus according to one embodiment of the invention. The apparatus is described hereinafter with reference to a specific example of its use.

EXAMPLE

The protection zone is represented in FIG. 4 by the line 1 between the bus bars 2 and 3 and consists of a line of length L=160 km, surge impedance Z=304 ohms, propagation velocity c=2.45 × 10⁸ m/s and phase constant $\beta = 1.278 \, 10^{-6}$ rad/m. The line may be considered to be one phase of a 3 phase system where, for simplicity, coupling to other phases is omitted. It is assumed that none of the other system parameters is known, apart from the measured values of the voltage and current at the monitoring point; these are detected by transducers 40 and 41 and continuously stored in the memory 42.

The apparatus includes polarity detectors 48 which compare the signs of the changes $\Delta V$ and $\Delta I$ in voltage and current at the disturbance to establish the direction from which the disturbance is travelling. Where the signs are the same, the disturbance detected is travelling towards the fault after reflection from some point beyond the monitoring point (i.e. to the left of the monitoring point in FIG. 4), and where the signs are opposite, the disturbance detected is travelling from the fault. A buffer memory 47 stores the sign, amplitude and time of arrival for subsequent pulses. A first arithmetic unit 46 is arranged to calculate the reflection coefficients from the first pulse and to obtain the sign and magnitude of pulses incident on and reflected from the monitoring point. A second arithmetic unit 49 sets up equations relating the location and resistance of the fault.

Second comparators 50 identify labelled pulses, while a third arithmetic unit 51 calculates the fault location from the time of travel of labelled pulses. Third comparators 52 determine whether the fault is within the protection zone before signalling to the circuit breakers 53 to open the circuit through the line.

Signals from the analogue-to-digital converter 43 and the memory 42 are processed in comparators 44 to obtain voltage and current disturbances and the following disturbances are detected:

$$\Delta V^{(1)} = 211 \text{ kV}$$

$$\Delta I^{(1)} = 2.08 \text{ kA}$$

The superscripts determine the order of arrival of the pulses. The polarity detectors 45 check the sign of the quantity $\Delta V^{(1)}/\Delta I^{(1)}$, and shows that the sign $\Delta V^{(1)}/\Delta I^{(1)}$ is negative and therefore the disturbance originates from a point to the right of the monitoring point and must be investigated further.

The peak value of the voltage $\hat{V}$ and the peak value of the current $\hat{I}$ at the monitoring point are readily available from the waveforms stored in the memory and in this example are $\hat{V} = 500$ kV, $\hat{I} = 3.78$ kA. Similarly the undisturbed voltage and current at the monitoring point at the instant of the arrival of the disturbance are $V_{(L)}' = 491.5$ kV and $I_{(L)}' = 3.78$ kA. The value of the phase angle corresponding to these values is $$\theta_1 = \text{arc cos } (V_{(L)}'/V) = 10.548°$$

$$\theta_2 = \text{arc cos } (I_{(L)}'/I) = -0.73°$$

Note that the sign of these angles is uniquely defined from the sampled waveforms.

The voltage and current at the monitoring point at the instance of the fault is then $$V_{(L)} = V \cos (\theta_1 - \phi) = 500 \cos (10.548° - \phi) \text{ kV}$$

$$I_{(L)} = I \cos (\theta_2 - \phi) = 3.78 \cos (-0.73° - \phi) \text{ kA}$$

where $\phi - \beta(L-d)$ and is directly related to the location of the fault d.

The voltage $V_1$ injected into the line as the result of the fault can be obtained by processing in the arithmetic unit 46 the voltage and current disturbances:

$$V_1 = (\Delta V^{(1)} - Z\Delta I^{(1)})/2 = (-211 - 304 \times 2.08)/2 = 422 \text{ kV}$$

Similarly the reflection coefficient $a_r$ at the monitoring point is:

$$a_r = \frac{\Delta V^{(1)} + Z \cdot \Delta I^{(1)}}{\Delta V^{(1)} - Z \cdot \Delta I^{(1)}} = \frac{-211 = 304 \times 2.08}{-211 - 304 \times 2.08} = -\frac{1}{2}$$

The generalised form of equation (1) hereinbefore recited is, for the case under consideration:

$$\frac{Z + 2R}{Z}\left[\frac{V_1}{V}\right] = -\cos\phi \sin\phi \left[\sin\theta + \frac{IZ}{V}\sin\theta_2\right]$$

$$-\cos^2\phi\left[\cos\theta_1 + \frac{IZ}{V}\cos\theta_2\right]$$

$$+ \frac{IZ}{V}\cos\theta_2$$

where R is the fault resistance, $\phi = \beta(L-d)$ and all other quantities are now known. This equation is set up in the second arithmetic unit 49 as follows:

$$\frac{304 + 2R}{304}(-0.845) = \cos\phi\sin\phi\ 0.153 - \cos^2\phi\ 3.28 + 2.3 \quad (2)$$

After the arrival of the first disturbance at the monitoring point a reflected pulse propagates towards the fault point. It is equal to $V_1 \cdot a_r = -422(-\frac{1}{2}) = 211$ kV. This is a labelled pulse and the apparatus is set up to detect it return to the monitoring point. Subsequent pulses are stored in the buffer memory 47.

The second pulse to arrive at the monitoring point is $V^{(2)} = 6.54$ kV, it arrives 130.3 $\mu$s after the original disturbance and comes from the right.

If it is assumed that this is the labelled pulse then the time of travel to the fault is 130.3 $\mu$s/2 = 65 $\mu$s hence $L-d = 65 \times 10^{-6} \times 2.45 \times 10^8 = 15.9$ km and $\phi = 1.17°$. By substituting in equation (2) the resistance of the fault is obtained: $R = 24.7$ ohms. If this is the labelled pulse then $\Delta V^{(2)}$ should be 211 kV$\cdot a_F(1+a_r)$ where $a_F$ is the reflection coefficient at the fault. Substitution in this expression gives for $\Delta V^{(2)}$ the value $-90.7$ kV. This compares unfavorably with the measured value of $\Delta V^{(2)}$ of 6.54 kV. Therefore the second pulse to arrive at the relaying point is not the labelled pulse.

The third pulse to arrive from the right is $\Delta V^{(3)} = 98.9$ kV and arrives 1.17 ms after the original disturbance. Assuming this to be the labelled pulse and by following the same procedure as for the second pulse the following values are obtained:

$$\phi = 10.5° \text{ and}$$

$$R = 9.63\ \Omega$$

The expected value of $\Delta V^{(3)}$ is then given by $$\Delta V^{(3)} = 211(-0.94)\ 0.5 = -99 \text{ kV}$$

This value agrees well with the measured value of −98.9 kV. The conclusion is that the third pulse is the labelled pulse and the fault is located at a distance (L-d) from the relay point given by $$L - d = \frac{\phi}{\beta} = \frac{10.5 \cdot \pi}{180 \times 1.278 \times 10^{-6}} = 143 \text{ km}$$

More pulses can be labelled to enhance confidence in the measurement.

We claim:

1. A method of determining the location of a fault occuring in an electric power transmission line, comprising the steps of
   (i) detecting at a point adjacent to one end of the line a first disturbance in voltage and/or current in the line resulting from occurence of the fault,
   (ii) comparing at least one characteristic of each disturbance detected after the first disturbance with the or each characteristic predicted from values measured in the first disturbance, and thereby identifying a reflected disturbance in voltage and/or current produced by reflection of the first disturbance from the said one end, or another point beyond said one end, and then from the fault,
   (iii) determining the time taken for the reflected disturbance to travel from the said point to the fault and back to the said point after reflection at the fault, and
   (iv) obtaining from said time the distance between the said point and the fault.

2. A method according to claim 1, comprising detecting a second reflected disturbance in voltage and/or current, produced by reflection of the first reflected disturbance from the said one end and then from the fault, and from the time elapsed between the detection of the first disturbance and the second reflected disturbance obtaining a confirmatory value of the distance between the said point and the fault.

3. A method of determining the location of a fault occurring in an electric power transmission line, comprising the steps of
   (i) measuring the voltage and current at regular intervals at a point adjacent to one end of the line and storing measured values representing at least the immediately preceding cycle or half-cycle of the alternating voltage and current,
   (ii) comparing each measured value with that for the corresponding instant in the preceding cycle or half-cycle and thereby detecting any disturbance in voltage and current,
   (iii) measuring the time elapsed from detection of the first disturbance in current and voltage resulting from occurrence of the fault to detection of the next disturbance in current and/or voltage,
   (iv) calculating from said elapsed time a value for the distance of the fault from the said point assuming said next disturbance to have resulted from direct reflection of the first disturbance from the said one end and then from the fault,
   (v) calculating from said distance value, from the values of the first disturbances in current and voltage, and from selected stored measured values, a predicted magnitude of disturbance of voltage and/or current for a direct reflection of the first disturbance from the said one end and then from the fault,
   (vi) comparing the measured magnitude of said next disturbance with the predicted magnitude, and if the difference between said measured and predicted magnitudes is greater than a predetermined amount repeating steps (iii), (iv), (v) and (vi) for the next disturbance detected,
   (vii) selecting the distance value calculated.

4. A method according to claim 3, comprising in parallel with steps (iv), (v), and (vi) the steps of
   (viii) comparing the polarities of the current and voltage change for said next disturbance and if the polarities are the same storing time of detection and voltage change,
   (ix) for each following disturbance detected, comparing the polarities of the current and voltage change and if the polarities are opposite in sign obtaining the time elapsed between detection of said next disturbance and detection of said following disturbance,
   (x) calculating from said elapsed time a value for the distance of the fault from the said point assuming said following disturbance to have resulted from direct reflection of said next disturbance from the fault,
   (xi) calculating from said distance value, said voltage change, the values of the first disturbances in current and voltage and selected stored measured values, a predicted magnitude of disturbance of voltage and/or current of a direct reflection of said next disturbance from the fault, and
   (xii) comparing the measured magnitude of said following disturbance with the predicted magnitude, and if the difference between said measured and predicted magnitudes is greater than a predetermined amount repeating steps (viii), (ix), (x), (xi) and (xii) for the next disturbance detected.

5. A method according to claim 3, comprising detecting a second reflected disturbance in voltage and/or current, produced by reflection of the first reflected disturbance from the said one end and then from the fault, and from the time elapsed between the detection of the first disturbance and the second reflected disturbance obtaining a confirmatory value of the distance between the said point and the fault.

6. An apparatus for determining the location of a fault occuring in an electric power transmission line, comprising
   (i) means for detecting at a point adjacent to one end of the line a first disturbance in voltage and/or current in the line resulting from occurrence of the fault,
   (ii) comparison and processing means arranged to compare at least one characteristic of each disturbance detected after the first disturbance with the or each characteristic predicted from values measured in the first disturbance and thereby to identify a reflected disturbance in voltage and/or current produced by reflection of the first disturbance from the said one end, or another point beyond said one end, and then from the fault,
   (iii) timing means for determining the time taken for the reflected disturbance to travel from the said point to the fault and back to said point after reflection at the fault, and
   (iv) further processing means for calculating from said time measured by the timing means the distance between the said point and the fault.

7. An apparatus for determining the location of a fault occurring in an electric power transmission line, comprising
- (i) current and voltage measuring devices connected to a point on the line adjacent to one end thereof,
- (ii) sampling means arranged to sample regularly the output from the measuring devices,
- (iii) a store arranged to receive the samples from the sampling means and to store samples representing at least the half-cycle of the waveform immediately preceeding each sample received,
- (iv) first comparison means for comparing each sample with the corresponding sample in the preceeding half-cycle,
- (v) timing means for measuring the time elapsed from detection of the first disturbance in current and voltage resulting from occurrence of the fault to detection of the next disturbance in current and/or voltage,
- (vi) first processing means arranged to calculate from said elapsed time a value for the distance of the fault from said point assuming said next disturbance to have resulted from direct reflection of the first disturbance from the said one end and then from the fault,
- (vii) second processing means arranged to calculate from said distance value, from the values of the first disturbances in current and voltage, and from selected stored measured values, a predicted magnitude of disturbance of voltage and/or current for a direct reflection of the first disturbance from the said one end and then from the fault,
- (viii) second comparison means for comparing the diffference between the measured magnitude of said next disturbance and the predicted value with a predetermined value and responsive to said difference being greater than said predetermined value to initiate further operation of the first and second processing means and the second comparison means for the next disturbance in current and/or voltage detected, and
- (ix) means responsive to said difference being equal to or smaller than said predetermined value to recieve from the first processing means the distance value calculated thereby.

8. An apparatus according to claim 7, wherein the store is arranged to store samples representing at least a complete cycle of the waveform immediately preceding each sample received, and the first comparison means is arranged to compare each sample with the corresponding sample in the lpreceding cycle.

9. An apparatus according to claim 7, further comprising third comparison means arranged to compare the calculated distance with a predetermined distance, and where the said distance is less than the predetermined distance to generate a control signal whereby a circuit breaker on the line may be caused to open.

* * * * *